United States Patent
Geiss et al.

[11] Patent Number: 6,069,049
[45] Date of Patent: May 30, 2000

[54] SHRINK-WRAP COLLAR FROM DRAM DEEP TRENCHES

[75] Inventors: Peter John Geiss; Howard Smith Landis, both of Underhill, Vt.; Son Van Nguyen, Hopewell Junction, N.Y.

[73] Assignee: International Business Machines Corporation, Armonk, N.Y.

[21] Appl. No.: 08/947,022

[22] Filed: Oct. 8, 1997

Related U.S. Application Data

[62] Division of application No. 08/467,353, Jun. 6, 1995.

[51] Int. Cl.⁷ .................. H01L 21/20; H01L 21/8242
[52] U.S. Cl. .................. 438/386; 438/243; 438/248; 438/391
[58] Field of Search .................. 257/301, 304, 257/305; 438/243, 386, 391, 248

[56] References Cited

U.S. PATENT DOCUMENTS

| | | | |
|---|---|---|---|
| 4,142,004 | 2/1979 | Hauser, Jr. et al. | 438/792 |
| 4,417,298 | 11/1983 | Nakata et al. | 361/540 |
| 4,432,935 | 2/1984 | Kubo et al. | 419/2 |
| 4,863,755 | 9/1989 | Hess et al. | 427/574 |
| 4,933,206 | 6/1990 | Cox | 257/59 |
| 5,125,136 | 6/1992 | Cho et al. | 29/25.01 |
| 5,250,444 | 10/1993 | Khan et al. | 438/162 |
| 5,416,341 | 5/1995 | Hayama | 257/59 |
| 5,505,157 | 4/1996 | Hara et al. | 117/2 |
| 5,677,219 | 10/1997 | Mazure' et al. | 438/243 |

FOREIGN PATENT DOCUMENTS 63-094680  4/1988  Japan .
63-094681  4/1988  Japan .

OTHER PUBLICATIONS

Wolf et al.; "Silicon Processing for the VLSI Era"; 1986; pp. 191–197.
Ghandhi; "VLSI Fabrication Principles"; 1983; pp. 427–429.
Wolf et al., "Crystalline Defects, Thermal Processing, and Gettering", Silcon processing for the VLSI Era—vol. 1, p. 57, 1986.

*Primary Examiner*—Carl Whitehead, Jr.
*Assistant Examiner*—Toniae M. Thomas
*Attorney, Agent, or Firm*—Whitham, Curtis & Whitham; Jay H. Anderson

[57] ABSTRACT

Crystal lattice dislocations in material surrounding trench capacitors and other trench structures are avoided by alteration of stresses such as decreasing compressive stresses and/or development of persistent tensile forces within material deposited in the trench and thus at the material interface formed by the trench. Such alteration of stresses is achieved by volume reduction of a film deposited in the trench. The material is preferably a hydrogenated nitride of silicon, boron or silicon-carbon alloy which may be reduced in volume by partial or substantially complete dehydrogenation during subsequent heat treatment at temperatures where the film will exhibit substantial creep resistance. The amount of volume reduction can be closely controlled by control of concentration of hydrogen or other gas or volatile material in the film. Further fine adjustment of stresses can be achieved in combination with this mechanism by volume reduction of other materials which may be used, in part, to confine the film through other mechanisms such as annealing.

11 Claims, 4 Drawing Sheets

SHRINK-WRAP COLLAR FROM DRAM DEEP TRENCHES

This application is a divisional of co-pending Ser. No. 08/467,353, field on Jun. 6, 1995.

BACKGROUND OF THE INVENTION

1. Field of the Invention

The present invention generally relates to the formation of trench structures in semiconductor electronic devices and, more particularly, to the formation of deep trench capacitor structures for integrated circuit memories.

2. Description of the Prior Art

The need for memory structures of increased device density has generally followed similar trends in other integrated circuit devices such as microprocessors in order to provide improvements in speed and function as well as economies of manufacture, so long as manufacturing yields can be maintained. Decreased circuit element size is generally accompanied by decreases in parasitic capacitances and decreased signal propagation time between circuit elements. The increase in number of circuit elements which can be formed on a single chip yields increases in functionality. Likewise, an increase in the number of circuit elements which can be formed on a single chip or wafer yields economies in manufacturing processes since more devices and chips can be simultaneously formed. However, in any given technology and for any particular design ground rules, such as minimum feature size, there is a trade-off between the minimum size or maximum integration density which can be achieved and the manufacturing yield.

Devices which rely on particular dimensions for their electrical properties, such as capacitors used in dynamic memories (e.g. dynamic random access memories (DRAM's)), however, present additional trade-offs in design. For example, if the area of capacitor plate electrodes is reduced (for a given electrode spacing and dielectric constant of the material therebetween) the capacitor value and charge storage capacity at a given working voltage will be reduced. (Of course, capacitance may be increased by reduction of electrode spacing, consistent with capacitor size reduction in integrated circuits, but reduction in charge storage can seldom be fully compensated as capacitor size is reduced.) On the other hand, if the capacitance of each cell is reduced to increase the number of cells without corresponding decrease in parasitic capacitance of word and bit lines connected to the memory cells, operating margins may be severely compromised. Further, as charge storage is reduced, other effects such as charge leakage become more critical to reliable operation. In view of these conflicting design considerations, so-called deep trench capacitor structures have become well-developed for the purpose of reducing capacitor "footprint" size on the chip or wafer while maintaining satisfactory capacitance values. However, deep trench (or, simply, "trench") capacitors are still subject to charge leakage.

Charge leakage, in particular, is of particular concern since capacitance of individual memory cell capacitors is necessarily small. At current levels of DRAM capacitor technology, a stored data bit may be represented by only several hundred electrons or even fewer. Therefore, even slight charge leakage may be sufficient to cause loss or at least compromise of stored data unless the memory refresh period is reduced. Corresponding increase in memory refresh frequency effectively increases average memory access time since the memory cannot be accessed during refresh operations.

Charge leakage is principally attributed to crystal lattice dislocations in the vicinity of the boundary of the capacitor. Such crystal lattice dislocations are believed to be due to stresses which may be caused during capacitor fabrication which are later relieved by the formation of crystal lattice dislocations. Thus, crystal lattice dislocations may form wherever such stresses are present and extend over a distance greater than the transverse dimension of the capacitor, itself. For example, present lithographic capabilities for trench capacitor technology allow a 0.25 $\mu$m capacitor size to be approached while crystal lattice dislocations can often extend 0.5 $\mu$m or more from the capacitor boundary. Therefore, full exploitation of potential integration density at the current state of lithographic technology is limited by permissible proximity of trench capacitors which cannot be spaced closer than twice the likely extent of crystal lattice dislocations without comprising isolation between capacitors.

Additionally, as trench dimensions of 0.25 $\mu$m are approached, it has been observed that crystal lattice dislocation density increases dramatically and has been observed as high as 100% (i.e. at least one dislocation at each capacitor) even at 0.5 $\mu$m dimensions, particularly when the "heat budget" subsequent to trench formation is not or cannot be sufficiently limited. It is theorized that this observed increase in crystal lattice dislocation density at reduced capacitor dimensions may be due, in significant degree, to the greater fraction of the trench which is occupied by the oxide dielectric collar when trench dimensions are decreased. Oxides deposited in recesses in a substrate or layer of semiconductor material can produce compressive stresses in the surrounding material by a variety of mechanisms and the greater proportion of oxide may produce relatively greater stresses and/or strain which cannot be withstood by the relatively smaller amount of surrounding material.

The mechanisms by which compressive stresses can occur are not unique to oxides. Numerous processes common in semiconductor manufacture result in volume expansion of a body of material. If the expanded material is surrounded by another material which does not undergo an equal or greater volume expansion, a compressive force will result. For example, a differential in thermal expansion between a body material and another material surrounding it is a reversible mechanism which can nevertheless cause stresses corresponding to the temperature excursion. Annealing relieves internal stresses, including stresses due to differential thermal expansion, at a high temperature but if differential contraction occurs when the materials are cooled, stresses will again occur and will be persistent. This effect is particularly true of oxides which shrink less than the substrate when cooled, resulting in persistent compressive stresses. Volume change may also occur during annealing due to changes in the crystal structure (e.g. amorphous to polycrystalline) at high temperature. Compressive stresses can also result from a volume increase in films due to inclusions or growth of materials (e.g. grown oxides), which may not be fully avoidable or occur spontaneously during other processes (e.g. impurity diffusion).

Given that a reduction in "footprint" of trench capacitors and other trench structures necessarily implies formation of structures within a body of material and the general tendency for routine processing to cause volume expansion of the enclosed material, the likelihood of compressive forces resulting in the material surrounding the trench is substantial. While several mechanisms such as recrystallization and chemical reactions are known to cause volume reduction, many are not compatible with devices being fabricated and volume reduction is generally very small and not well-controllable. In any event, at the present state of the art, a solution to the problem of formation of crystal lattice dislocations is necessary to enable further increases in integration density of trench structures in general and deep trench capacitors in particular and to exploit the present capabilities of lithographic processes for integrated circuit manufacture.

Hydrogenated films of various materials are known in the art and a small hydrogen content is recognized to increase growth rates of deposited material and to produce some other generally desirable effects on the film. It is theorized that hydrogen fills dangling bonds in as-deposited amorphous material and may thus accelerate deposition or film growth. However, it is generally considered desirable to limit the amount of hydrogen in the film and to maintain the beneficial effects of hydrogenation by maintaining the hydrogen content substantially unchanged through any subsequent processing which may be done. Further, dehydrogenation, itself, does not alter the bonds between atoms of the material as would occur during recrystallization and significant or controllable volume change would not be expected to result from dehydrogenation of films having as-deposited hydrogen contents generally considered to be beneficial.

SUMMARY OF THE INVENTION

It is therefore an object of the present invention to provide a trench structure for integrated circuit devices which has a reduced likelihood of formation of crystal lattice dislocations.

It is another object of the invention to provide a trench capacitor structure which can be reliably formed at increased integration density with high manufacturing yield.

It is a further object of the invention to provide an integrated circuit memory structure having increased charge storage retention time.

It is yet another object of the invention to provide a structure which can selectively and controllably provide a reduction in volume and produce a reduction in compressional stress and/or a tensile stress in an integrated circuit structure and which is substantially insensitive to other semiconductor fabrication processes.

In order to accomplish these and other objects of the invention, a method of altering stresses in a body of crystalline material is provided including the steps of depositing a film including a gas or a volatile material on a surface of the body of solid material, and removing a portion of the gas or volatile material from the film.

In accordance with another aspect of the invention, a device is provided including a body of solid material, and a partially dehydrogenated film bonded to a portion of said body of material.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
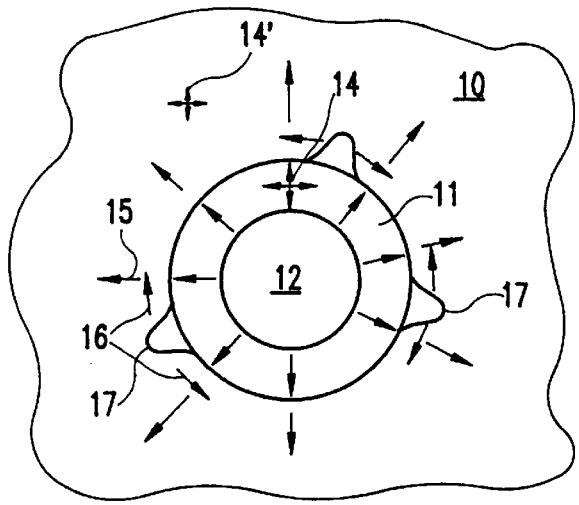
FIGS. 1A and 1B are plan views of a trench capacitor useful for understanding the principles of the invention.

Referring now to the drawings, and more particularly to FIG. 1A, there is shown a plan view of a trench and an oxide capacitor dielectric collar as would be used in a capacitor formed in an integrated circuit device. This Figure is designated as "Related Art" since arrows designating stresses are intended to be indicative of the problem encountered in devices more subject to the formation of crystal lattice dislocations than the present invention and to which the present invention provides a solution. However, it is to be understood that no portion of the structure illustrated in FIG. 1A is to be considered as an admission of prior art as to the present invention. Also, the shape of the trench, in plan view, is relatively arbitrary as a matter of design convenience and unimportant to the practice of the invention; a somewhat elongated oval shape being preferred to the circular form illustrated for reasons not relevant to the practice of the present invention. Further, it is to be understood that the principles of the invention are not necessarily limited to capacitor structures but are considered to be applicable to other devices and structures such as transistors and isolation structures having a closed outline in plan view and similarly subject to the formation of crystal lattice dislocations due to similar mechanisms. The illustrations provided by the drawings are largely schematic and details which are not important to the practice of the invention are omitted in the interest of clarity. persistent stresses at any interface between materials having different thermal expansion coefficients since stress will be relieved by viscous reflow and/or crystallographic changes at high temperatures which will be essentially fixed as the materials are cooled; the differing amounts of volume contraction during cooling giving rise to persistent stresses.

Such stresses, if compressive, will result in some degree of elastic deformation or strain which radiates outward from the trench as shown by arrows 15. This deformation will be greatest at the boundary of the trench and will result in tensile forces in the direction indicated by arrows 16. Any irregularity in the perimeter of the trench (as is virtually inherent, particularly if a non-circular trench is formed, such as where curvature changes or is maximized) will tend to concentrate these forces and thus nucleate crystal lattice dislocations 17 to relieve the stress by inelastic deformation when the stress becomes sufficiently great in a localized area.

Figure 1B:
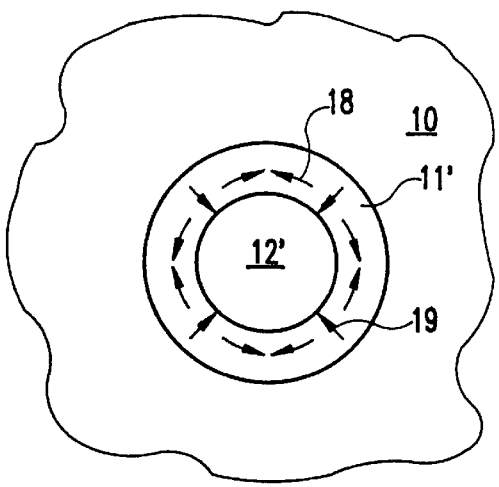

It has been found by the inventors that crystal lattice dislocations appear to principally occur in response to compressive forces. While not wishing to be held to any particular theory in regard to the production of dislocations, such as the scenario described above, a marked reduction in the formation of crystal lattice dislocations in response to even small tensile forces or reduction of compressive stress at (i.e. across) the interface of substrate or layer 10 and collar 11 has been consistently observed. More specifically, as shown in FIG. 1B, if a volume reduction can be achieved in collar 11', as To form a capacitor, a trench is formed in a semiconductor (e.g. silicon, germanium, etc.) substrate or one or more layers 10 in the form of a blind aperture. Collar 11 is then formed by an isotropic deposition of an oxide, nitride or other suitable dielectric and may be formed as a plurality of layers (e.g. oxide-nitride-oxide (ONO)). The remainder of the trench is then filled with semiconductor material, generally to form the opposing capacitor plate 12; one capacitor plate which may be common to a plurality of capacitors fabricated on the same chip being formed by substrate or layer 10. Additional fabrication steps which usually involve heat treatment will generally be required such as for the formation of electrical connections and switching transistors for sense amplifiers and the like to form a memory structure.

During such heat treatment and other processing steps, differential volume expansion may occur between the collar 11 and substrate 10, as indicated by the differently sized arrow arrays 14 and 14' due to mechanisms such as those described above which result in transient or persistent compressive forces in substrate or layer 10 surrounding collar 11. Additionally, persistent compressive forces may occur as an incident of deposition of collar 11 and or fill 12 or subsequent treatment thereof, such as annealing and/or impurity implantation. Further, annealing, as is generally required following impurity implantation and other known processing steps, may also cause a differential volume change which results in persistent compressive force in the vicinity of collar 11. Annealing may also cause indicated by arrows 18, or in fill 12' or both, such as by compressive force (indicated by arrows 19) on the fill 12 from collar 11, there will be no outward radiation of compressive stress or strain from the trench. It is also possible that the crystal lattice of substrate or layer 10 can withstand a greater amount of elastic deformation in tension than in compression and/or that tensile forces across the interface of the collar 11 and substrate or layer 10 causes compression of the crystal lattice of substrate or layer 10 parallel to the interface and prevents the nucleation of dislocations. However, it is also to be expected, regardless of the mechanism by which the formation of dislocations appears to be suppressed, that tensile forces can also cause nucleation of dislocations if sufficiently great or adhesion at material interfaces cannot withstand the amount of tensile stress developed. Therefore, it is important that any mechanism for developing tensile stresses be accurately controllable if reliable suppression of the formation of crystal lattice dislocations is to be achieved.

The inventors have further discovered that substantial and significant bulk volume reduction can be achieved in some material films, including some dielectric films, by increasing the amount of hydrogen in the as-deposited (e.g. amorphous) film and later driving off most if not all of the hydrogen. This effect can be achieved even though the material bonds in the as-deposited film are not modified during dehydrogenation. It is theorized that the hydrogen attached to dangling bonds in the as-deposited film simply distorts the bonds between atoms of the film material and, when driven off, allows the atoms in the film to assume a more compact arrangement even though the remaining bonds are not significantly modified. Since substantial amounts of hydrogen can be added to the as-deposited film, the distortion of the bonds in the material can be made very large with the unexpected result that, upon dehydrogenation, the volume reduction can be made substantially greater than the volume reduction which can be achieved through crystallization (e.g. a transition from an amorphous form to polycrystalline or monocrystalline form). Further, the volume reduction is highly predictable and controllable. Any hydrogen remaining in the film may be limited to a concentration which may be beneficial to the quality of the film while still obtaining substantial and highly controllable volume reduction. As-deposited hydrogen concentration can be made to vary from a minimum of one to two atomic percent (as distinguished from weight percent) to as much as thirty-five atomic percent by control of the deposition conditions, particularly temperature and hydrogen concentration in the reactant gases. An exemplary volume reduction of 25% has been observed for "complete" dehydrogenation of a film having an as-deposited hydrogen concentration of 18 atomic percent, measured as a decrease in film thickness. Dehydrogenation is considered as being "complete" when no further hydrogen gas is evolved during further thermal annealing although some amount of hydrogen undoubtedly remains in the film.

Volume reduction is most easily measurable as a reduction in film thickness. The change in film thickness is generally proportional to the amount of hydrogen which can be driven off during heat treatment and may be closely approximated by $$\Delta t = k \Delta C_H$$

where $\Delta t$ is the change in film thickness, $\Delta C_H$ is the change in hydrogen concentration in the film and k is a constant of proportionality which is dependent on the material system. In a SiC:H film for example, $0.75<k<1.5$. Recalling, however, that some small atomic percentage of hydrogen will remain in a film where dehydrogenation is "complete" and that higher concentrations of hydrogen are much more readily driven off, volume reduction for as-deposited films with a high concentration of hydrogen is substantially greater than would be expected by extrapolation from volume reduction of hydrogenated films commonly used in semiconductor device which have a limited hydrogen concentration. That is, a reduction of hydrogen concentration from, for example 20% to 4% would yield a far greater volume reduction than a reduction of hydrogen concentration from 5% to 1% and could be accomplished at a substantially lower temperature and duration of heat treatment. Conversely, substantially the same amount of volume shrinkage for changes of hydrogen content from 30% to 20% and 20% to 10%.

It should be noted that the only requirements for practice of the invention are that hydrogen or other suitable volatile material can be incorporated in the as-deposited film and that the film resist creep at normal processing temperatures. Nitrides of silicon, boron and silicon/carbon alloys, stoichiometric or otherwise, which may be deposited by plasma enhanced chemical vapor deposition (PECVD) or low pressure chemical vapor deposition (LPCVD) are particularly appropriate to the practice of the invention since they are highly creep resistant and their annealing or crystalline transition temperature is very high. In theory, the invention could be practiced with other (e.g. adsorbed or otherwise gasified) gases or other volatile materials (e.g. having high vapor pressure at elevated temperatures, such as mercury) deposited with the film (but not forming compounds therewith) and which can be later driven off (e.g. to degasify the film). However, hydrogen is considered to be much preferred since the properties of hydrogenated films, including temperatures required for dehydrogenation, are well-known; the effects of small amounts of hydrogen remaining in the film are generally beneficial; and hydrogen, being a very small atom or molecule, out-diffuses very readily from the film during dehydrogenation even if the hydrogenated film is overlaid with numerous other layers and structures prior to dehydrogenation. Further, depending on the principal material of the film, dehydrogenation can be made to take place at any of a number of temperatures over a relatively wide range to accommodate required heat budgets of other processing steps which may be desired. Combinations of film materials may also be used to cause fractional dehydrogenation at each of a plurality of discrete temperatures or to regulate the rate of dehydrogenation during heat treatment (e.g. with gradually increasing temperature).

In order to provide a controlled degree of volume reduction and production of tensile stress in an integrated circuit device in accordance with the embodiment of the invention presently preferred by the inventors, collar 11' is preferably made of a hydrogenated nitride film deposited by plasma chemical vapor deposition. (While the dielectric constant of silicon nitride is higher (~12) than silicon oxide (~4), which may be an important consideration in some applications, the dielectric constant is not particularly significant to the preferred application of the invention to trench collar structures which principally provide isolation. Therefore, virtually any insulator material could be used.) Other deposition processes are possible for practice of the invention but plasma CVD is preferred since the amount of hydrogen in the deposited film may be most readily controlled. Appropriate conditions for PECVD processes in a commercially available reactor would include a plasma frequency of approximately 13 MHz over a wide range of suitable powers and having a $SiH_nX_{4-n}$ (where X is $CH_3$ or halogen such as Cl or F) silicon source; a $N_2$, $N_3$ or $NH_nX_{3-n}$ nitrogen source; a $CH_nX_{4-n}$ carbon source and a $BH_nX_{3-n}$ boron source. Later partial or "complete" removal of the hydrogen by heat treatment will result in a potentially large volume reduction of the film, as described above. Further, the amount of volume reduction can be accurately controlled by the proportion or concentration of hydrogen in the deposited film. For example, with these reactants, the amount of hydrogen available from the reactants can be readily varied by choice or mix of the nitrogen source. As an additional control of the development of persistent tensile forces and control of compression of the fill 12', the fill material may be deposited in an amorphous form, for example, by appropriate temperature control in many known techniques, and made to undergo a volume reduction by annealing to polycrystalline or monocrystalline form; resulting in volume reduction of the fill.

Tensile stress in the surrounding body of material depends on the ratios of elastic moduli of the materials of the film and the confining material to which it is bonded for a given amount of volume reduction. Generally stated, the greater the volume reduction and the stiffer the collar material, the greater the tensile stress which can be obtained. The materials described as preferred for the collar material will exhibit a stiffness between 10 and 350 GPa and thus, a wide range of tensile stresses can be developed for a given volume change and a given stiffness of surrounding materials.

The optimum stress state in a structure such as an integrated circuit DRAM depends on the design layout and manufacturing processes the amount of compressive stress to be counteracted and will also be a function of volume expansion during other processing and the stiffness of the materials. As a practical matter, optimization of the stress state in a structure is best done empirically for each individual application. However, compressive stresses can be readily estimated from known expansion data for most semiconductor processes and a close approximation of the amount of shrinkage to be provided may be closely estimated from the proportion described above. Generally speaking, however, the amount of shrinkage and tensile stress which is available in accordance with the invention is much greater than generally required and empirical data may be readily generated by different amounts of heat treatment to drive off different amounts of hydrogen and the optimum stress developed can be determined by inspection. If it is then found advantageous or necessary, the amount of shrinkage can be substantially duplicated for other amounts of heat treatment or desired final hydrogen content by conversion of the change of hydrogen concentration to the change which would be required for the altered heat treatment of final hydrogen content, thus establishing the proper as-deposited hydrogen concentration to achieve the optimum final stress state.

It is considered preferable to limit heat exposure during trench fill and planarization such that the film will not be significantly dehydrogenated during the fill process. It is a particular advantage of the invention that when the hydrogenated film is fully confined and well-bonded to the substrate surface and the surface of the fill material and if the total strain energy is less than that required for delamination (e.g. a work fracture energy for SiC:H on a <100>Si surface is $4J/m^2$—a very large number indicating that delamination would not be expected in commonly encountered integrated circuit structures and film thicknesses), the entire effect of volume reduction achieved through partial or complete dehydrogenation is applied to the production of tensile stress. Therefore, a quantitative relationship will exist between the amount of hydrogen in the as-deposited film and the tensile stress which will be derived from dehydrogenation, as described above. Further, while tensile forces will not be persistent if the dehydrogenated film is allowed to reflow during subsequent heat treatment steps, the preferred films of SiN:H and BN:H are sufficiently creep-resistant that the allowable heat budget is large and the process in accordance with the invention can generally be considered as independent of other required processes.

Other films which may be used in the practice of the invention include, but are not limited to Si, N, SiBN and silicon-carbon alloys such as Sic and SiCN which represent a relatively large family of materials and combinations thereof; the stoichiometry of which is variable over a wide range. (In contrast, hydrogenated carbon films, although known, do not behave in this fashion and are inappropriate to the practice of the invention. Likewise, the invention cannot be practiced with films of oxides and metals.) Most of these materials to which the principles of the invention may be applied to particular advantage will be recognized to be refractory materials having annealing or crystalline transition temperatures which are far in excess of the temperature (e.g. 200° C.–1000° C.) necessary for complete dehydrogenation. That is, the allowable heat budget to maintain persistent tensile forces is greater than the allowable heat budget for other processes which would normally be included in integrated circuits.

Referring now to FIGS. 2–8 the formation of an exemplary trench capacitor will be described. It is to be understood, however, that a trench capacitor is a preferred application of the invention since the invention solves a current and severe problem in DRAM technology. The principles and application of the invention which will be described will allow those skilled in the art to apply the principles of the invention to other structures, such as isolation structures, as well as other capacitor designs. It is also to be understood that the particular capacitor structure illustrated includes structures which are generally considered desirable in such structures, regardless of the particular design thereof, and details which are unimportant to the practice of the invention are omitted in the interest of clarity.

Figure 2:
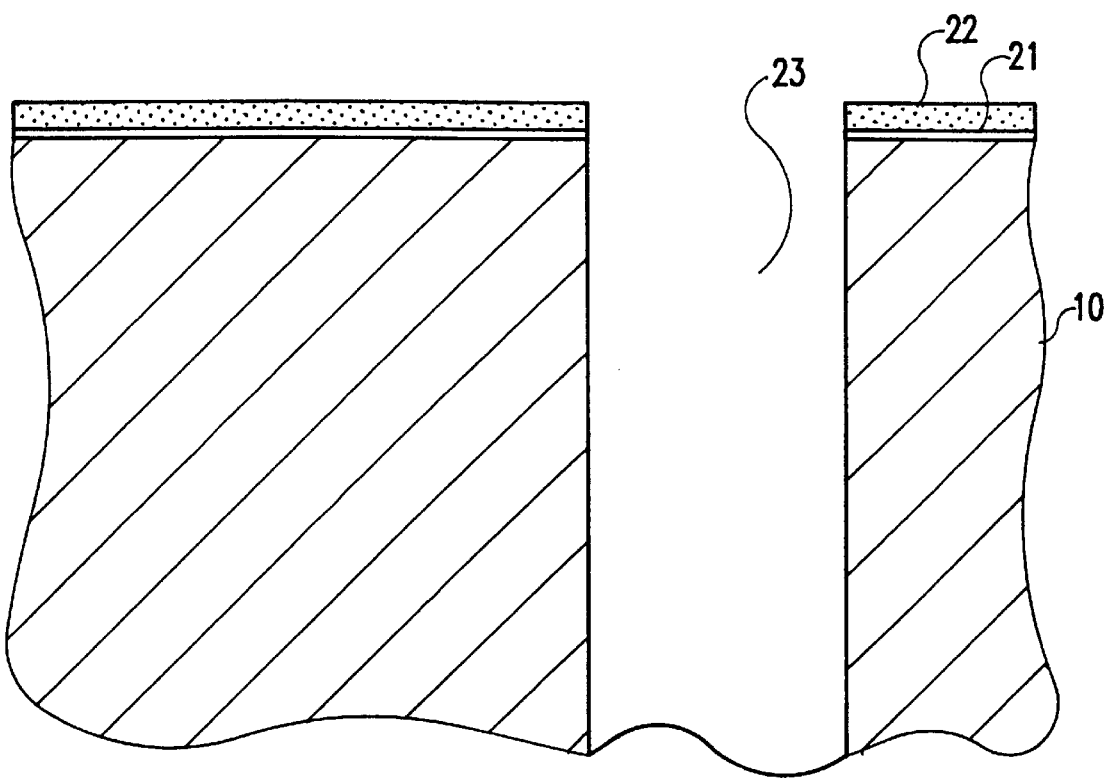
Figure 3:
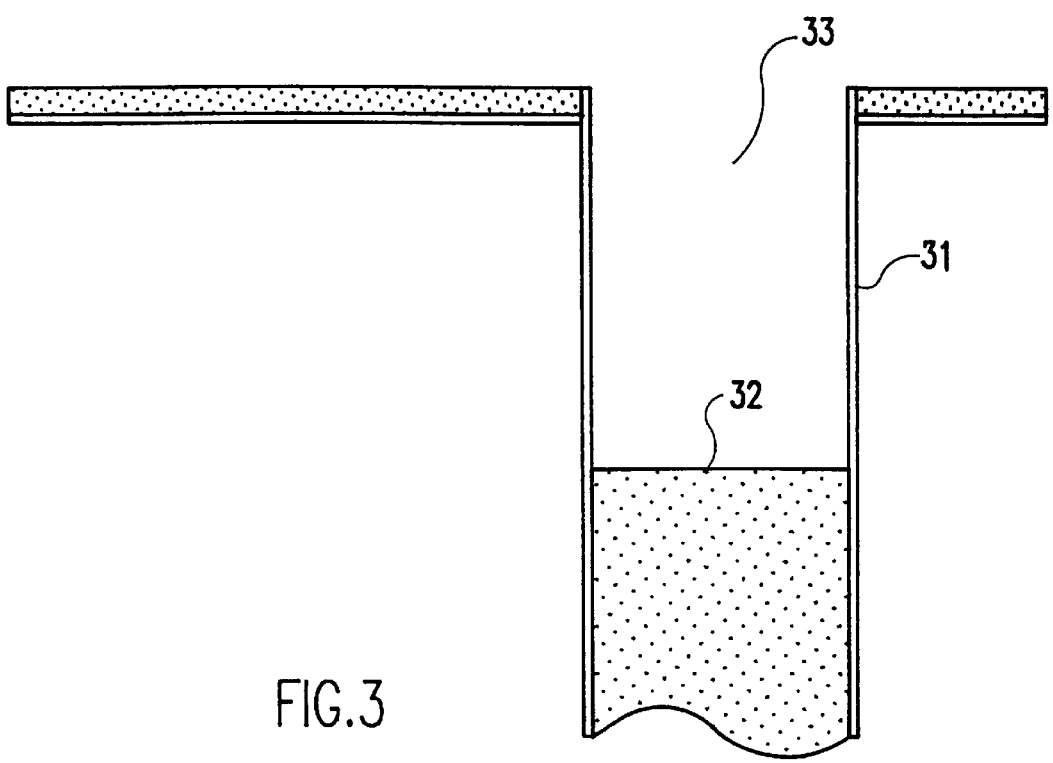

FIG. 2 shows an initial stage in the formation of a trench capacitor in accordance with the invention in which a substrate 10 of, for example, monocrystalline semiconductor (e.g. silicon) material is overlaid with appropriate pad films 21, 22 of materials such as a silicon dioxide underlayer with a SiBN overlayer in a wide range of Si:B:N ratios (and not merely the stoichiometric species) deposited thereon and a deep trench 23 formed therein and through the pad layers 21 and 22. Then, as shown in FIG. 3, a capacitor trench dielectric 31 is formed on the sidewalls of the trench by any known process and a recessed trench fill 32, preferably of semiconductor material similar to the substrate but preferably of polycrystalline form (or amorphous form which can be later annealed to polycrystalline or monocrystalline form, as noted above), is deposited to form a capacitor plate structure. The techniques of deposition and formation of the recess 33 are not important to the practice of the invention and many suitable techniques are known, such as filling the trench, planarizing to pad layer 22 and etching the recess by selective etching of the fill material while other surfaces are protected by the pad layer 22 and the dielectric layer 31.

Figure 4:
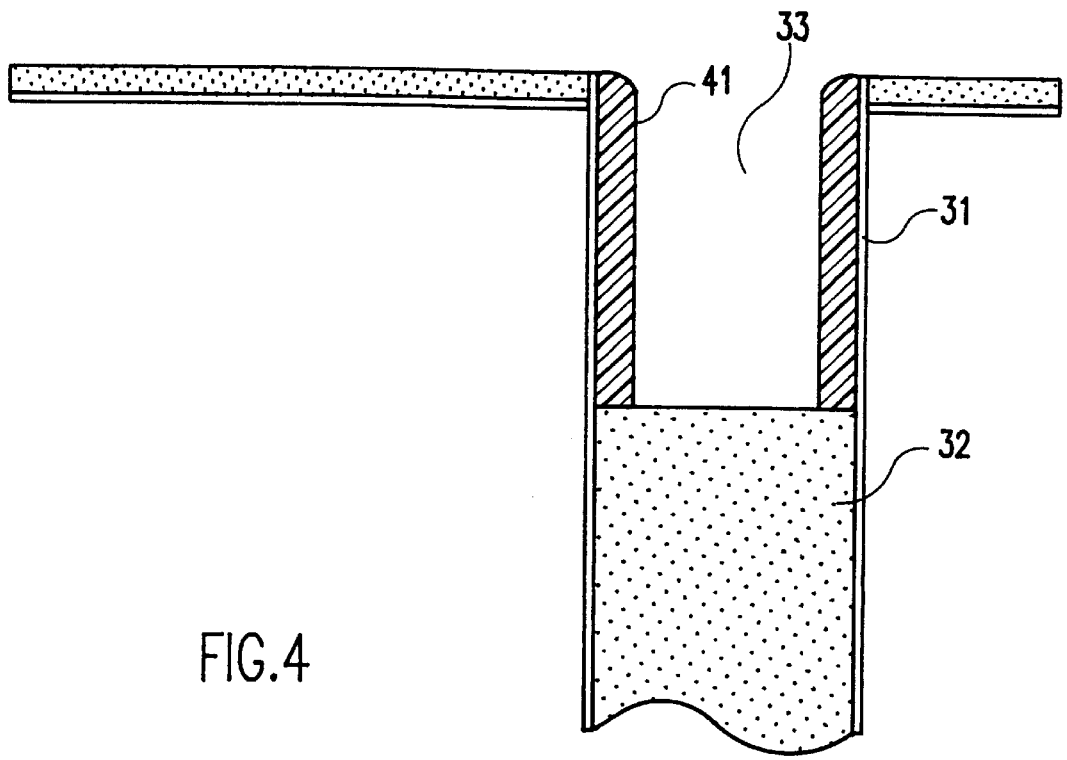
Figure 5:
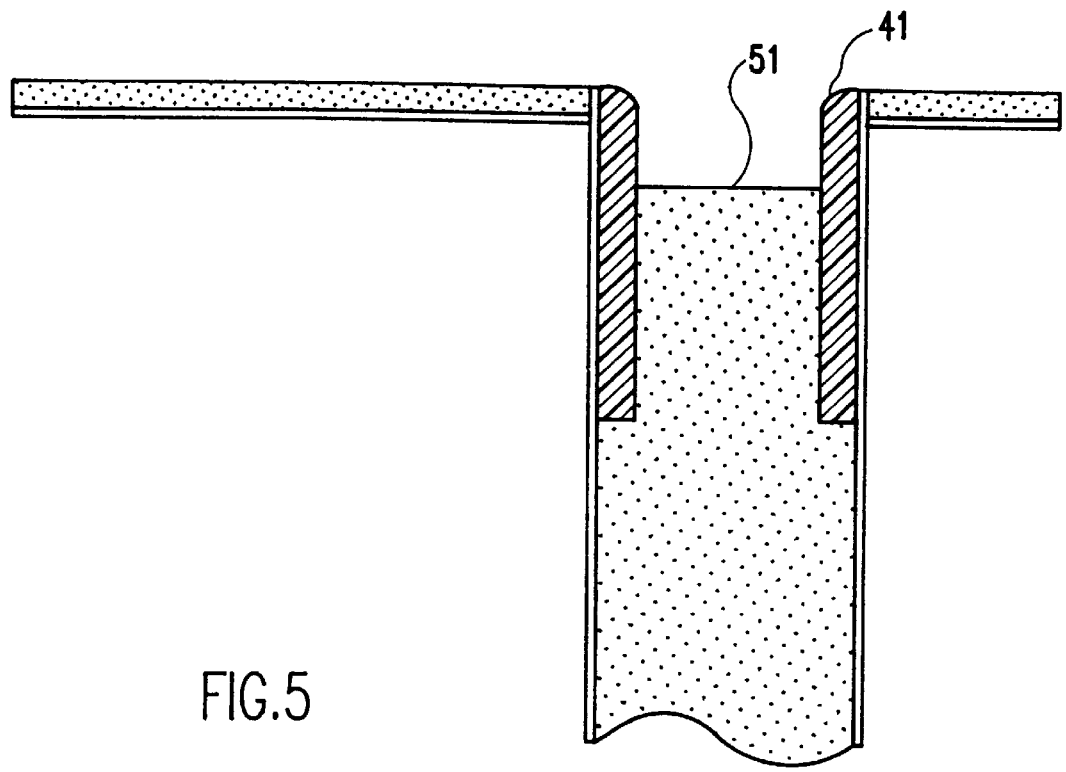

As shown in FIG. 4, the capacitor collar 41 of hydrogenated film such as the preferred SiN:H or BN:H, noted above, may now be applied to the trench sidewalls (over dielectric layer 31) in recess 33 above the recessed fill 32 and, as shown in FIG. 5, a further recessed fill 51 formed within the collar 41. As with fill material 32, the technique of fill and recess formation are not important to the invention but the process should be chosen to proceed at a temperature lower than a temperature which would cause significant dehydrogenation of the material forming collar 41. Also, depending on the nature of the dielectric film 31 as an effective diffusion barrier at the temperatures of further processing steps and if a BN:H film is used for collar 41 it may be necessary to apply an additional film of conventional SiN over the dielectric 31 in recess prior to formation of collar 41 to prevent out-diffusion of boron into substrate 10. In this regard, out-diffusion of boron into fill 32 or 51 is not likely to compromise the capacitor but, should such out-diffusion into the fill be undesirable, further SiN or other diffusion barrier can be formed over the inner surface of the collar 41, as well.

Figure 6:
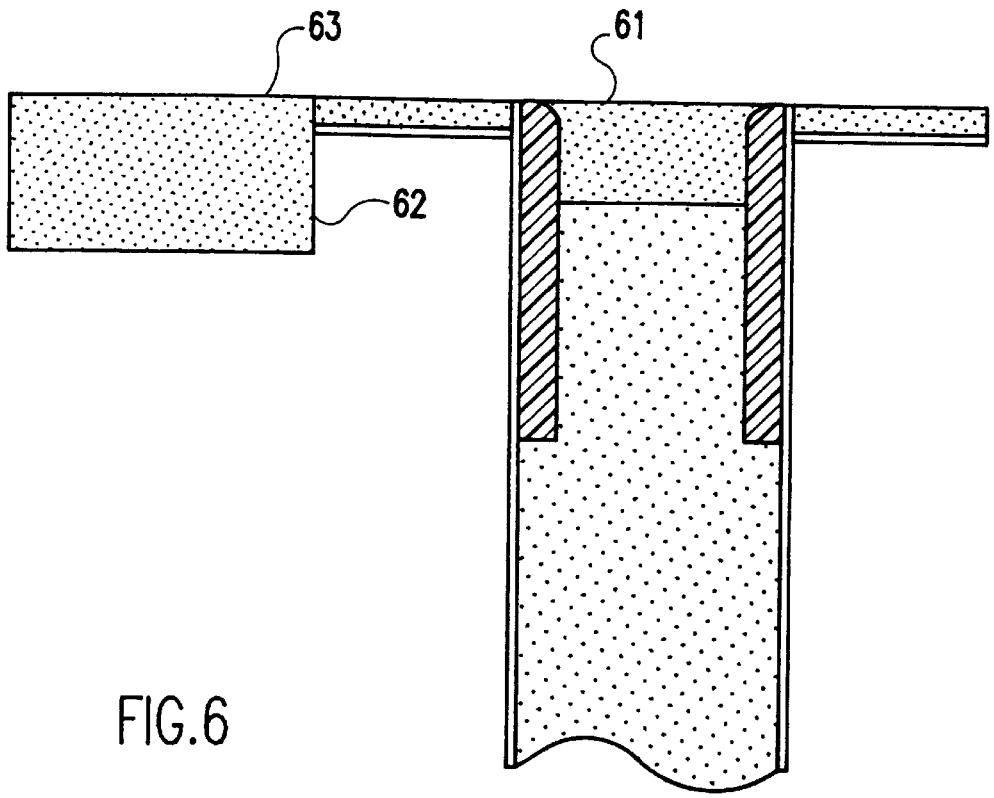

Referring now to FIG. 6, assuming a plurality of capacitors are to be formed, a shallow trench 62 may be formed in substrate 10 such as by etching with a block-out mask (since registration is relatively non-critical) and an isolation oxide 63 deposited therein to form an isolation structure. Trench top oxide 61 can be deposited concurrently and the structure again planarized. A separate deposition step would be required if a different fill material was used (e.g. another or similar hydrogenated film). It should also be noted that this fill material inside the collar completes confinement of the preferred hydrogenated film so that all volume reduction which may be developed during later dehydrogenation (or driving off or other materials) is directly applied to the production of tensile stresses (or reduction of compressive stresses) in the material surrounding the trench.

Figure 7:
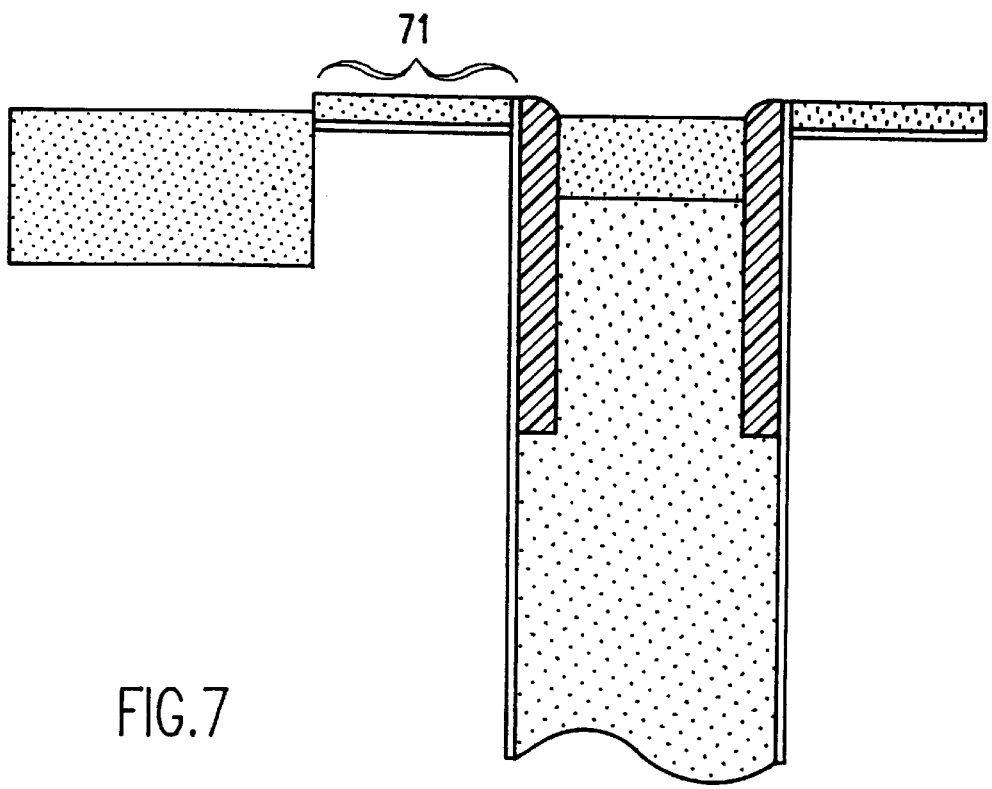

Then, as shown in FIG. 7, trench top oxide 61 and isolation oxide 63 can be annealed to cause volume reduction. The collar 41 may also be dehydrogenated before or after such annealing, if performed, as well as concurrently with such annealing, as may be desired or dictated by the materials. Both annealing and the driving off of gases or other volatile materials have the effect of altering stresses by decreasing compressive stresses and/or producing persistent tensile stresses in region 71; the latter mechanism being the potentially greater volume reduction and, hence, greater effect. While annealing may often be done at higher temperatures (but at a lower temperature than required for annealing of the collar film, which should be avoided), and thus may be used for a fine adjustment of the tensile forces (in which the dimensions of the isolation oxide 63 may also be significantly and advantageously exploited, since it is generally larger than trench top oxide (or other fill material 61)) subsequent to driving off of gases or volatile materials, concurrent volume reduction of oxides 61, 63 and collar 41 will result in the smallest excursion of compressive forces in trench top oxide or other fill material 61, should that be found to be significant, as well as reducing the number of process steps.

Figure 8:
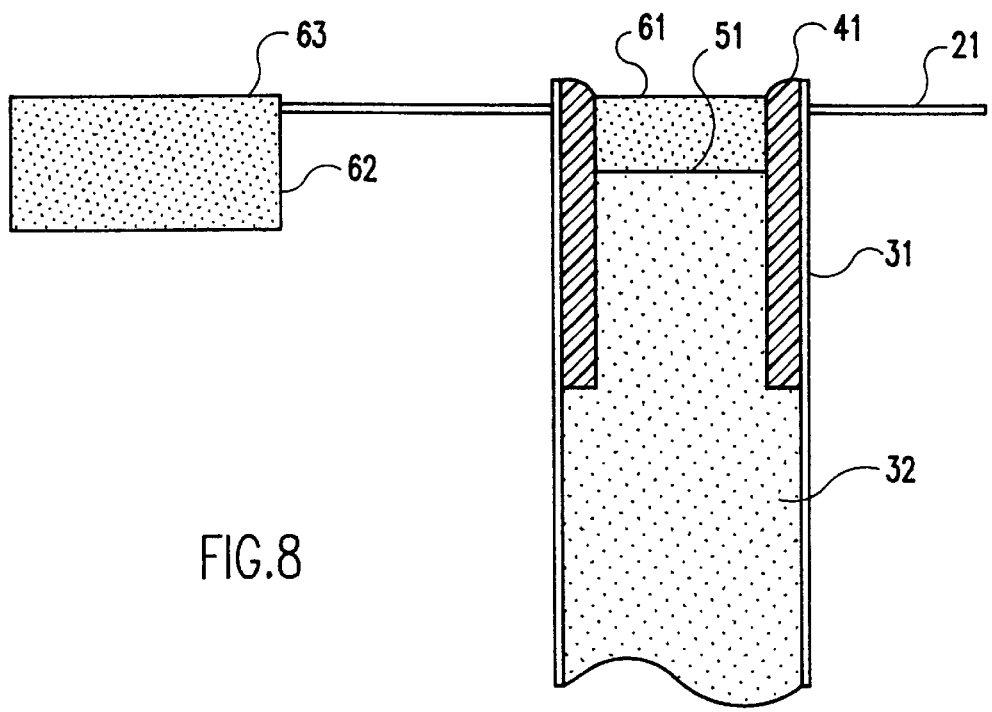
FIGS. 2, 3, 4, 5, 6, 7 and 8 illustrate, in a cross-sectional view, formation of an exemplary trench capacitor in accordance with the principles of the invention.

Finally, as shown in FIG. 8, pad film 22 can be removed by any known suitable process. If SiN:H is used for the collar 41 material, it may be convenient to fabricate pad film 22 from SiBN so that it can be wet etched with high selectivity to the collar. Pad film 21 may otherwise be advantageously used as an etch stop or to otherwise terminate this process while protecting substrate 10. Finally, conductors (not shown) may be connected to portions of the capacitor as desired to complete the capacitor.

From the foregoing, it is readily seen that the principles of the invention can be applied wherever it is desirable to locally reduce compressive stresses or produce persistent tensile stresses in a body of crystalline material such as a semiconductor layer or substrate, whether or not the deposited gasified film is buried within the bulk of such material. All that is necessary is that a material be deposited in a trench or other cavity in the body of, or on a surface of solid material, together with a controlled concentration of hydrogen or other material that can be driven off by subsequent thermal treatment and that the film be resistant to creep in either gasified or degasified form, particularly at the temperature required for degasification (i.e. dehydrogenation).

While the invention has been described in terms of a single preferred embodiment, those skilled in the art will recognize that the invention can be practiced with modification within the spirit and scope of the appended claims. For example, bonding of a hydrogenated film to a surface of a sheet of material or layer deposited thereon can produce compressive stresses on one side and tensile stresses on the other when the film is dehydrogenated in accordance with the principles of the invention.

Having thus described my invention, what I claim as new and desire to secure by Letters Patent is as follows:

1. A method of altering stresses in a body of solid material including the steps of depositing a film including at least one of a gas and a volatile material on a surface of said body of solid material, reducing volume of said film deposited in said depositing step by removing a portion of said at least one of a gas and a volatile material from said film, thereby reducing compressive stresses and crystal lattice dislocation in said body of solid material, and confining said film.

2. A method as recited in claim 1, wherein said film is a hydrogenated film.

3. A method as recited in claim 1, wherein said surface is an interior surface of a trench.

4. A method as recited in claim 4, wherein said film is deposited in the form of a collar.

5. A method as recited in claim 4, wherein said confining step includes the further step of filling a portion of an interior of said collar with a fill material.

6. A method as recited in claim 5, including the further step of annealing said fill material.

7. A method as recited in claim 1 wherein said surface of said body of solid material is an interior surface of a cavity within said body of solid material.

8. A method as recited in claim 7, including the further step of filling a remainder of said cavity.

9. A method as recited in claim 1, wherein said solid material is a crystalline material.

10. A method as recited in claim 1 wherein said film comprises one or more nitrides of silicon, boron and silicon/carbon alloys.

11. A method of altering stresses in a body of solid material including the steps of depositing a film including at least one of a gas and a volatile material on a surface of said body of solid material, and reducing volume of said film deposited in said depositing step by removing a portion of said at least one of a gas and a volatile material from said film, wherein said surface is an interior of a trench and said film is deposited in the form of a collar within the trench.

* * * * *